United States Patent
Muramatsu et al.

(10) Patent No.: US 6,703,289 B2
(45) Date of Patent: Mar. 9, 2004

(54) METHOD FOR FORMING CRYSTALLINE SILICON LAYER AND CRYSTALLINE SILICON SEMICONDUCTOR DEVICE

(75) Inventors: Shinichi Muramatsu, Ibaraki (JP); Yasushi Minakawa, Ibaraki (JP); Fumihito Oka, Ibaraki (JP); Tadashi Sasaki, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/007,670

(22) Filed: Dec. 10, 2001

(65) Prior Publication Data

US 2002/0132455 A1 Sep. 19, 2002

(30) Foreign Application Priority Data

Mar. 14, 2001 (JP) ........................................ 2001-071595

(51) Int. Cl.⁷ .......................... H01L 21/20; H01L 29/04
(52) U.S. Cl. .................... 438/486; 438/488; 257/64; 257/75
(58) Field of Search ................ 438/486, 487, 438/488; 257/49, 64, 75

(56) References Cited

U.S. PATENT DOCUMENTS

| | | | | |
|---|---|---|---|---|
| 4,433,202 A | * | 2/1984 | Maruyama et al. | 136/255 |
| 4,781,766 A | * | 11/1988 | Barnett et al. | 136/258 |
| 5,608,232 A | * | 3/1997 | Yamazaki et al. | 257/66 |
| 5,696,003 A | * | 12/1997 | Makita et al. | 438/166 |
| 5,808,321 A | * | 9/1998 | Mitanaga et al. | 257/72 |
| 5,824,573 A | * | 10/1998 | Zhang et al. | 438/150 |
| 5,882,960 A | * | 3/1999 | Zhang et al. | 438/166 |
| 5,895,933 A | * | 4/1999 | Zhang et al. | 257/49 |
| 6,107,639 A | * | 8/2000 | Yamazaki et al. | 257/49 |
| 6,156,628 A | * | 12/2000 | Ohnuma et al. | 438/486 |
| 6,413,805 B1 | * | 7/2002 | Zhang et al. | 438/166 |

FOREIGN PATENT DOCUMENTS

| | | | | |
|---|---|---|---|---|
| JP | 05-048532 | | 2/1993 | ........... H01L/21/20 |
| JP | 07-128920 | | 4/1995 | ........... H01L/21/20 |

OTHER PUBLICATIONS

1994, IEEE First World Conference on Photovoltaic Energy Conversion, vol. II, thin–film Polycrystalline Si Solar Cell on Glass Substrate Fabricated by a Novel Low Temperature Process, K. Yamamoto et al. pp. 1575–1578.
1999, Applied Physics Letters, vol. 74, No. 13, Kinetics of Nickel–Induced Lateral Crystallization of Amorphous Silicon Thin–film Transistors by Rapid Thermal and Furnace Anneals. L Lam et al. pp. 1866–1868.
1990, Materials Research Society, Silicide Precipitation and Silicon Crystallization in Nickel Implanted Amorphous Silicon Thin Films, vol. 5, No. 10, Cammarata et al. pp. 2133–2138.

* cited by examiner

*Primary Examiner*—Matthew Smith
*Assistant Examiner*—Lex H. Malsawma
(74) *Attorney, Agent, or Firm*—Antonelli, Terry, Stout & Kraus, LLP

(57) ABSTRACT

A plurality of linear catalytic metal element portions are arranged at predetermined intervals just on or just beneath an amorphous silicon layer, and, in this state, the amorphous silicon layer is heat treated to crystallize the amorphous silicon layer and consequently to form a polycrystalline silicon layer. This construction can realize the provision of a method for the formation of an evenly oriented, high-quality crystalline silicon layer in a large area, and a crystalline silicon semiconductor device produced by this method.

14 Claims, 7 Drawing Sheets

METHOD FOR FORMING CRYSTALLINE SILICON LAYER AND CRYSTALLINE SILICON SEMICONDUCTOR DEVICE

BACKGROUND OF THE INVENTION

1. Field of the Invention

The invention relates to a method for forming a crystalline silicon layer and a crystalline silicon semiconductor device, and more particularly to a method for forming a crystalline silicon layer which can form an evenly oriented, high-quality polycrystalline or single-crystal silicon layer in a large area, and a crystalline silicon semiconductor device produced by said method.

2. Prior Art

Elements comprising a crystalline silicon layer grown on a foreign substrate are known as a material suitable for semiconductor devices such as solar cells and semiconductor elements on SOI (silicon on insulator). Semiconductor devices using these elements do not require a large-area, high-quality silicon crystal substrate and thus are advantageous in that a significant reduction in cost can be expected and, in addition, by virtue of the absence of the silicon substrate, an increase in speed of circuit operation can be expected.

In general, in order to provide excellent properties in this type of semiconductor devices, the quality of the crystalline silicon layer to be formed should be enhanced. Therefore, the use of heat-resistant but expensive substrates, such as quartz which can withstand high temperatures, is indispensable. This generally poses a problem of a limitation on cost reduction due to the use of expensive substrates.

In order to solve this problem, a method has been proposed which comprises melt crystallizing an amorphous silicon layer grown on a substrate, for example, by laser annealing to form a crystalline silicon layer on the substrate. This method is disclosed in K. Yamamoto et al., 1994 IEEE First World Conference on Photovoltaic Energy Conversion (Hawaii in 1994) pp. 1575–1578. This method is described to suppress a temperature rise of the substrate and thus to realize the use of low-cost substrates.

According to this method, however, the diameter of crystal grains, which can be formed, is about 1 $\mu$m, and, thus, the crystals as such cannot be put to practical use. In recent years, crystals having a larger diameter could have become produced, and, for example, the production of crystals having a size exceeding 100 $\mu$m has been reported. The production of crystals having a size exceeding 1 cm square, however, has not been reported yet. Therefore, evenly forming a crystal over the whole area of a substrate having a size exceeding 30 cm is utterly impossible to realize. Further, there is an additional problem that a crystal region having a small grain diameter is formed around the crystal formed by this method. For this reason, it should be said that the method reported in the above literature cannot be put to practical use without difficulty.

In order to advantageously grow a crystalline silicon layer, R. C. Cammarata et al. have proposed a method which comprises the steps of: bringing a metal catalyst into contact with amorphous silicon; and, in this state, performing heat treatment to crystallize the amorphous silicon layer [J. Mater. Res., Vol. 5, No. 10 (1990) pp. 2133–2138]. This method is described as a method which can form a crystalline silicon layer at a low temperature and at a high speed and, in particular, crystallization at a low temperature can be achieved, for example, by introducing a very small amount of a nickel metal and then performing heat treatment.

L. K. Lam et al. have confirmed that, according to this method, when the object is a thin film having a thickness of about 100 nm, such as a TFT element, the crystallization advances in an in-plane direction by several $\mu$m and, thus, a high-quality crystal having good orientation in the in-plane direction can be obtained [Appl. Phys. Lett., Vol. 74, No. 13 (1999) pp. 1866–1868]. Further, a method for enhancing performance has been proposed, as a method utilizing growth with orientation, wherein a metal catalyst is selectively disposed near the position of a TFT element and, in this state, heat treatment is carried out to crystallize amorphous silicon, whereby an element is formed within crystal grains (Japanese Patent Laid-Open No. 244104/1994).

The above conventional methods, however, cannot produce semiconductor devices for solar cells and the like. Specifically, although the convention methods could be successfully applied to TFT elements of which the crystal area is about 100 $\mu$m, in the case of solar cells or semiconductor devices is about such as integrated circuits, a high-quality crystal should be grown over substantially the whole area of the substrate. This cannot be realized by the conventional methods.

SUMMARY OF THE INVENTION

Accordingly, it is an object of the invention to provide a method for forming an evenly oriented high-quality crystalline silicon layer in a large area, and to provide a crystalline silicon semiconductor device produced by said method.

According to the first feature of the invention, a method for forming a crystalline silicon layer, comprises the steps of: forming an amorphous silicon layer on a substrate; heat treating the amorphous silicon layer in the presence of a catalytic metal element to crystallize the amorphous silicon layer, wherein a plurality of linear catalytic metal element portions are arranged at predetermined intervals just on or just beneath the amorphous silicon layer formed on the substrate, and the amorphous silicon layer is heat treated to crystallize the amorphous silicon layer in the presence of the linear catalytic metal element portions to form a crystalline silicon layer.

According to the second feature of the invention, a crystalline silicon semiconductor device comprises: a substrate; a laminate comprised of crystalline silicon layers; and an electrode provided at a predetermined position, said crystalline silicon layer having been formed by heat treating an amorphous silicon layer just on or just beneath which a plurality of linear catalytic metal element portions have been arranged at predetermined intervals.

Preferably, from the viewpoint of ensuring the formation of a crystalline silicon layer over the whole area of the substrate, the liner catalytic metal element portions are arranged so as to spread over the whole area or substantially the whole area of the substrate. The intervals of the catalytic metal element portions are, for example, several hundred $\mu$m to several mm which is useful for the crystallization of the amorphous silicon layer on the whole area of the surface of the substrate.

Therefore, the amorphous silicon layer, just on or just beneath which the catalytic metal element portions have been arranged, can be crystallized so as to highly conform to any area of the substrate by the provision of linear catalytic metal element portions without any particular limitation on the number of linear catalytic metal element portions arranged and by properly setting the intervals of the linear catalytic metal element portions. As a result, the formation of an oriented crystalline layer having a large area, which has been difficult to realize in the prior art, can be easily realized.

The linear catalytic metal element portions are in many cases in the form of lines or strips having an identical width and are generally linearly arranged. However, if necessary, for example, the width of the linear catalytic metal element portion may be changed between both ends thereof, or the linear catalytic metal element portion may be bent between both ends thereof.

The step of arranging the linear catalytic metal element portions just beneath the amorphous silicon layer is preferably carried out in such a manner that grooves are formed on the surface of the substrate and filled with the catalytic metal element and the amorphous silicon layer is then formed on the substrate. In this case, a method is generally adopted which comprises the steps of: coating a solution of a catalytic metal element; wiping off the solution present on the outside of the grooves; and then drying the coated catalytic metal element solution to leave the catalytic metal element within the grooves. Since the catalytic metal element is received in the grooves, the surface of the substrate is smooth. This can avoid the formation of local protrusions of the catalytic metal element on the amorphous silicon layer formed on the substrate.

According to a preferred embodiment, the adoption of the following method is recommended. A plurality of amorphous silicon layers having a shape such as a strip are juxtaposed, and, in addition, a liner catalytic metal element portion is disposed just on or just beneath one end of each of the amorphous silicon layers. In this state, heat treatment is carried out. According to this method, the portion containing a high concentration of a catalytic metal element in the formed crystalline silicon layer can be provided in a portion which is not the center of each of the crystalline silicon layers, preferably at an end opposite to the end where the catalytic metal element has been disposed. This permits the catalytic metal element to be concentrated on that portion. Therefore, whereas, when the catalytic metal element has been provided at the center portion of the silicon layer, excessive heat treatment causes the portion containing a high concentration of the catalytic metal element located at the center portion to be spread by diffusion, the above structure involves this problem.

Catalytic metal elements include nickel, iron, cobalt, platinum, copper, and gold.

The amorphous silicon layer preferably has a dopant concentration in the range of a low concentration, which is on a substantially i type level, to $2\times10^{20}/cm^3$. When the dopant concentration falls within this concentration range, both the quality of the resultant crystal can be improved and, in addition, the crystallization speed can be increased. Materials for constituting the amorphous silicon layer usable herein include silicon, silicon hydride, halogen-containing silicons, and silicon-base compounds or alloys, such as SiC, SiN, SiO, and SiGe. In particular, when, in $Si_{1-x}Ge_x$, X is set to not more than 0.3, that is, so as to provide a low germanium concentration region, a good crystallization acceleration effect can be provided. In particular, when a laminate comprising germanium placed on nickel is used, two elements exhibit synergistic effect. As a result, crystallization can proceed at a high speed. Thus, an advantage of efficiency can be attained. Further, according to this embodiment, the produced polycrystalline silicon layer consists essentially of silicon crystal. Therefore, a high-quality crystalline silicon layer can be formed.

The heat treatment for the transformation of the amorphous silicon layer to the crystalline silicon layer is preferably carried out in the temperature range of 450 to 700° C., more preferably in the temperature range of 500 to 650° C. The heat treatment is preferably carried out in a nitrogen, hydrogen, argon, or halogen atmosphere or in vacuo.

Among others, heating, for example, to 400° C. in a hydrogen atmosphere to form a silicide or to reduce the amount of hydrogen contained in the layer followed by heating, for example, to about 550° C. results in the formation of a crystalline silicon layer having particularly good orientation.

A portion with a high catalytic metal element concentration corresponding to the portion, where the linear catalytic metal element portion has been located, and a portion with a low catalytic metal element concentration corresponding to a position intermediate between the catalytic metal element portions are formed in the crystalline silicon layer. These portions have substantially no influence on the characteristics of the semiconductor device. However, regarding these catalytic metal element-containing portions, when more strict control is required, the step of removing these portions is sometimes additionally provided.

The formation of other crystalline silicon layer on the polycrystalline or single-crystal silicon layer formed according to the invention to thereby form a predetermined epitaxial layer as a semiconductor device is embraced, as an extension of the above-described matter, within the embodiment of the invention. According to the invention, this embodiment can reduce the concentration of the catalytic metal element included in the other crystalline silicon layer to a low level of not more than $1\times10^{17}/cm^3$. This level can be mentioned as one feature of the semiconductor device produced by the invention.

Materials for constituting the substrate used in the invention include, for example, inorganic materials, such as glass, sapphire, and ceramics, or metallic materials, such as SUS, molybdenum, and tungsten. The formation of a crystalline silicon layer on silicon oxide, a nitride film, a metal film for an electrode, or a conductive film, such as a zinc oxide film, poses no problem.

Further, in the semiconductor device according to the invention, the position of the electrode provided on the upper side of the crystalline silicon layer may vary depending upon the type and construction of the semiconductor device. For example, the electrode may be provided just on the crystalline silicon layer formed according to the invention or on other layer formed on the crystalline silicon layer.

BRIEF DESCRIPTION OF THE DRAWINGS

The invention will be explained in more detail in conjunction with the appended drawings, wherein:

FIGS. 7A and 7B are electron micrographs showing the inhibition of crystallization by a high concentration of a dopant, wherein FIG. 7A shows the results of doping with a high concentration of phosphorus and FIG. 7B shows the results of doping with a high concentration of boron.

DESCRIPTION OF THE PREFERRED EMBODIMENTS

Preferred embodiments of the method for forming a crystalline silicon layer and the crystalline silicon semiconductor device according to the invention will be explained in conjunction with the accompanying drawings.

EXAMPLE 1

Figure 1A:
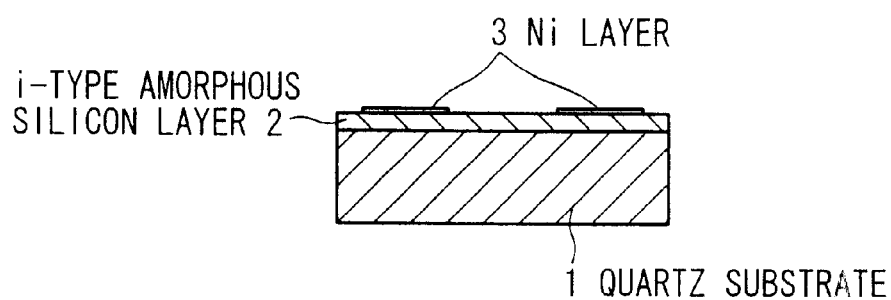
FIGS. 1A and 1B are cross-sectional views of products in the course of the formation of a crystalline silicon layer according to a preferred embodiment of the invention.

FIG. 1 shows a preferred embodiment of the invention wherein an evenly oriented polycrystalline silicon layer has been formed on the whole area of a quartz substrate. At the outset, in FIG. 1A, a quartz substrate 1 having a size of 5 cm square was provided. A mixed gas composed of $H_2$ and $SiH_4$ was introduced to the surface of the substrate, the substrate was heated to 400° C. while maintaining the pressure within the system at 0.3 Torr (about 40 Pa), and, in this state, a 50 nm-thick i-type amorphous silicon layer 2 was formed on the surface of the quartz substrate 1 by RF-discharge p-CVD.

Next, a 0.2 nm-thick nickel thin film was formed by vapor deposition on the silicon layer 2 which was then photoetched so that a plurality of nickel layers 3 in a line (strip) form having a width of 15 $\mu$m were linearly arranged at a pitch of 250 $\mu$m. Thereafter, heat treatment was carried out in nitrogen gas at 550° C. for 20 hr to crystallize the amorphous silicon layer 2. In this connection, it should be noted that, in FIG. 1, for simplification of the drawing, the nickel layer 3 was formed in only two places (this is true of the other drawings).

Figure 1B:
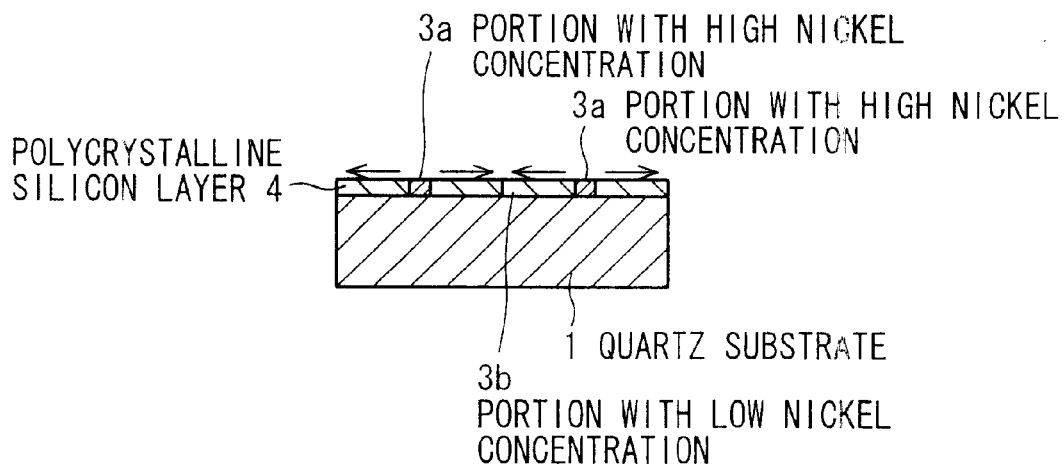

FIG. 1B shows the state of the assembly during and after the heat treatment. Portions 3a (width 15 $\mu$m) with a high nickel concentration are formed in the amorphous silicon layer 2 in its portion, which has been in contact with the nickel layer 3 in FIG. 1A, and portions 3b (width 0.5 $\mu$m) with a low nickel concentration are formed at an intermediate point between these portions 3a with a high nickel concentration. The crystallization of the amorphous silicon layer 2 advances from the portion 3a with a high nickel concentration in a direction indicated by an arrow and ends with the portion 3b with a low nickel concentration.

As a result of the crystallization, a polycrystalline silicon layer 4, which occupies 96% of the total area of the substrate 1, was formed between the portion 3a with a high nickel concentration and the portion 3b with a low nickel concentration. Thus, it was confirmed that the whole area of the substrate 1 having a size of 5 cm square was covered with the polycrystalline silicon.

Figure 2:
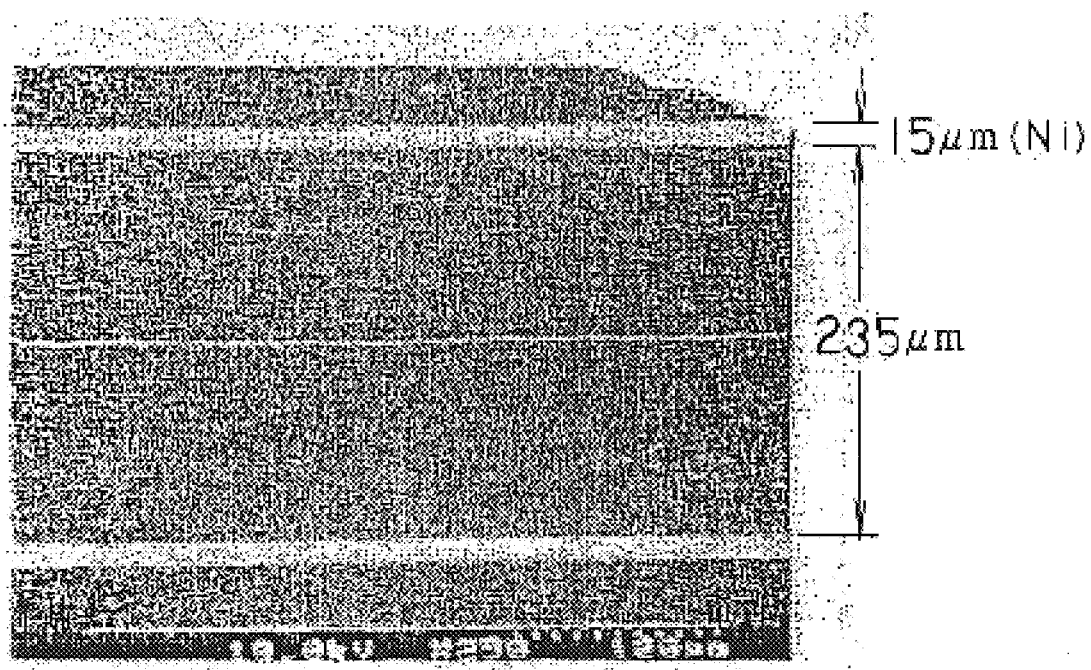
FIG. 2 is an electron micrograph of a crystalline silicon layer which has been formed according to the preferred embodiment shown in FIGS. 1A and 1B.

FIG. 2 is a scanning electron micrograph of the polycrystalline silicon layer 4 after the heat treatment, wherein the nickel-containing portions 3a, 3b have been removed by secondary etching. As is apparent from FIG. 2, the silicon layer was crystallized in such a state that the orientation linearly advances from the portion 3a with a high nickel concentration towards the portion 3b with a low nickel concentration. Further, a high-concentration n-type diffusion layer, a silicon nitride gate insulation layer, and a wiring layer (all of these layers not shown) were formed by the TFT (thin film transistor) formation process on the polycrystalline silicon layer 4, and the mobility of TFT was measured and found to be 120 cm$^2$/Vs. Thus, better characteristics than those in the case of laser beam crystallization could be obtained.

EXAMPLE 2

FIG. 3 shows a preferred embodiment of the invention which has been applied to a solar cell of a type such that a crystalline silicon layer and other layer are provided as a laminate on a metal substrate and light is introduced through the substrate in its side remote from the crystalline silicon layer.

Figure 3A:
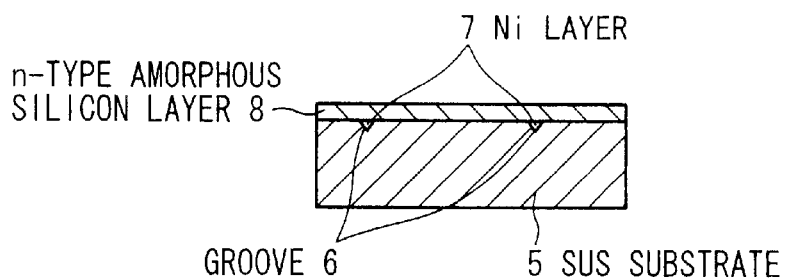
FIGS. 3A and 3B are cross-sectional views of products in the course of the preparation of a semiconductor device according to another preferred embodiment of the invention.

In FIG. 3A, an SUS substrate 5 was first provided. Linear V-shaped grooves 6 having a width of 2 $\mu$m and a depth of 0.5 $\mu$m were formed at intervals of 2 mm on the surface of the SUS substrate 5. A nickel salt solution was then spin coated thereon, and the solution present on the flat portion was wiped off, followed by drying to form a plurality of linear nickel layers 7.

Next, a mixed gas composed of $H_2$, $SiH_4$, and $PH_3$ [$SiH_4$:$PH_3$=1000:0.5 (molar ratio)] was introduced into a portion on the SUS substrate 5, and p-CVD utilizing RF discharge was carried out under conditions of pressure 0.3 Torr (about 40 Pa) and substrate temperature 300° C. to form an 80 nm-thick n-type amorphous silicon layer 8 which was then heat treated at 630° C. in hydrogen gas for 5 hr.

Figure 3B:
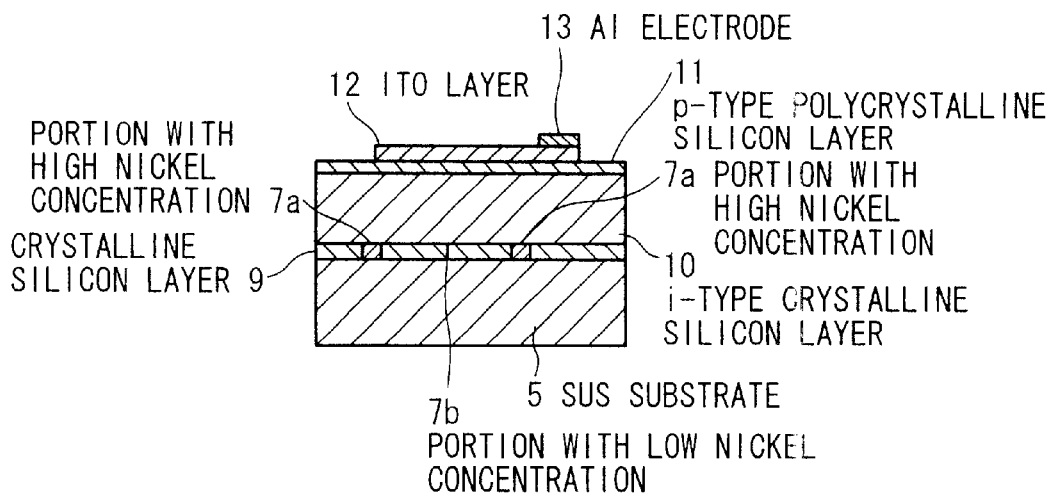

FIG. 3B shows the state of the assembly after the heat treatment. As is apparent from FIG. 3B, portions 7a with a high nickel concentration were formed in the n-type amorphous silicon layer 8 in its portion which has been in contact with the nickel layer 7 in FIG. 3A. In this case, the crystallization advanced from this portion in the in-plane direction and ended with a position intermediate between the portions 7a with a high nickel concentration. A portion 7b with a low nickel concentration was formed in this position, and a crystalline silicon layer 9 was formed between the portion 7a with a high nickel concentration and the portion 7b with a low nickel concentration. The layer 9 had very good crystallinity. By virtue of this very good crystallinity, the dopant utilization was about 90%, and the electrical resistivity was 1×10$^{-3}$ Ω.cm.

Next, a mixed gas composed of $H_2$ and $SiH_4$ was introduced to the formed crystalline silicon layer, and low pressure CVD was carried out at a substrate temperature of 620° C. to grow an i-type crystalline silicon layer 10 to a thickness of 5 $\mu$m. Thereafter, a mixed gas composed of $H_2$, $SiH_4$, and $B_2H_6$ was introduced to the i-type crystalline silicon layer 10, and p-CVD was carried out under conditions of substrate temperature 400° C. and 50 MHz while maintaining the pressure at 0.5 Torr (about 67 Pa). Thus, a 15 nm-thick p-type polycrystalline silicon layer 11 was grown.

A 70 nm-thick ITO layer 12 as a transparent electrode was then formed on the p-type crystalline silicon layer 11, and a 1 $\mu$m-thick aluminum electrode 13 was partially formed thereon. Thus, a semiconductor device for a solar cell having a predetermined construction was prepared.

The i-type crystalline silicon layer 10 in this semiconductor device was examined by X-ray analysis for the crystallinity. As a result, it was found that the layer has been monocrystallized and the nickel component was substantially absent in the layer.

Figure 4:
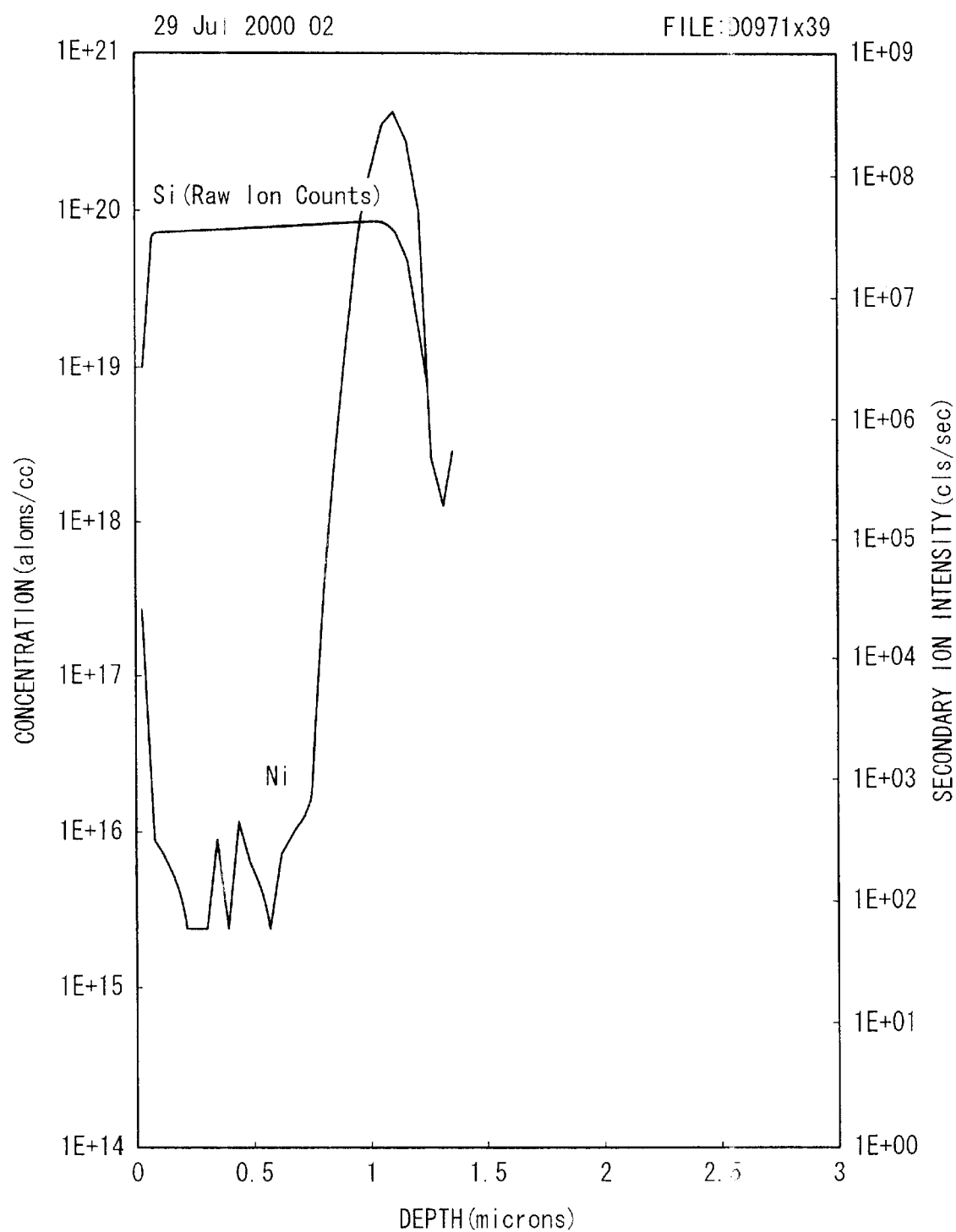
FIG. 4 is a diagram showing the results of measurement of the concentration of nickel in an i-type crystalline silicon layer formed on the crystalline silicon layer in the preferred embodiment shown in FIGS. 3A and 3B.

FIG. 4 shows the results of measurement of the concentration of nickel in the i-type crystalline silicon layer 10 in its portion, which is located on the portion 7a with a high nickel concentration and thus is expected to have a high nickel concentration, by SIMS analysis. According to the results of the measurement, the nickel concentration was on a low level of not more than $1 \times 10^{17}/cm^3$ and was not high enough to cause actual harm. The fact that the nickel concentration at the position, which is expected to have the highest nickel concentration, is the above low value, demonstrates that other portions clearly have much lower nickel concentration than the above value.

EXAMPLE 3

In the same manner as in Example 2, an n-type amorphous silicon layer 8 was formed. Thereafter, an i-type amorphous silicon layer having a thickness of 5 μm and a content of hydrogen, in the layer, of not more than 0.1% was formed on the n-type amorphous silicon layer 8 by sputtering from a silicon target material at a rate of 10 nm/sec. The assembly was then subjected to solid phase growth treatment by heating at 600° C. to form an i-type crystalline silicon layer (corresponding to a portion indicated by a reference character 10 in FIG. 3).

Further, the same layers and electrode as described in Example 2 were formed thereon to form a predetermined semiconductor device. The i-type crystalline silicon layer was then examined for crystallinity. As a result, it was found that the construction of the crystal was better than that in Example 2. Further, the characteristics of a solar cell using this semiconductor device were on a high level which was identical to the level in the case where a single-crystal substrate having a reduced thickness was used.

EXAMPLE 4

Figure 5A:
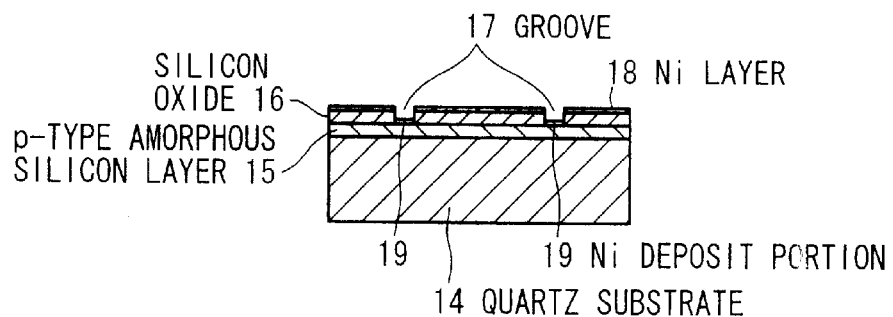
FIGS. 5A to 5D are cross-sectional views of products in the course of the formation of each silicon layer according to a further preferred embodiment of the invention.

In FIG. 5A, a mixed gas composed of $H_2$, $SiH_4$, and $B_2H_6$ was introduced to the surface of the quartz substrate 14, and low pressure CVD was carried out at a substrate temperature of 540° C. to form a 50 nm-thick p-type amorphous silicon layer 15. Further, 30 nm-thick silicon oxide 16 was formed by CVD, followed by photoetching to form a plurality of linear grooves 17 at a pitch of 500 μm.

Figure 5B:
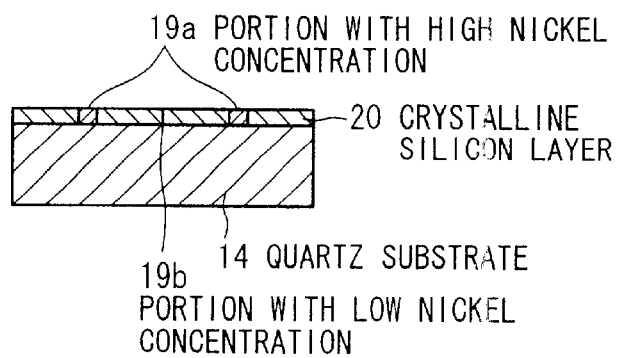

Nickel was then vapor deposited thereon to form a nickel layer 18, and, in this process, a nickel deposit 19 was formed at the bottom of the grooves 17. Heat treatment was then carried out at 580° C. for 20 hr in nitrogen gas to crystallize the p-type amorphous silicon layer 15. In FIG. 5B, numeral 20 designates a crystalline silicon layer formed by this process, and numerals 19a and 19b respectively designate a portion with a high nickel concentration and a portion with a low nickel concentration formed within the crystalline silicon layer 20 by this process.

Figure 5C:
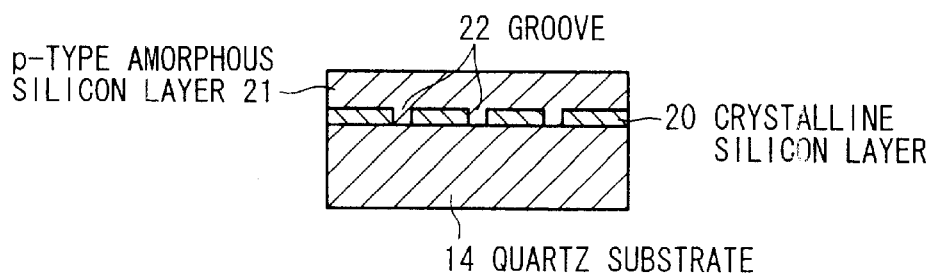

FIG. 5C is a diagram showing a state such that, after the portion 19a with a high nickel concentration and the portion 19b with a low nickel concentration were removed from the crystalline silicon layer 20 by etching, a 200 nm-thick p-type amorphous silicon layer 21 was grown. The growth was carried out by means of a molecular beam deposition device utilizing ultrahigh vacuum. As a result, the grooves 22 after the removal of the portion 19a with a high nickel concentration and the portion 19b with a low nickel concentration were filled with a crystalline silicon layer 21.

Figure 5D:
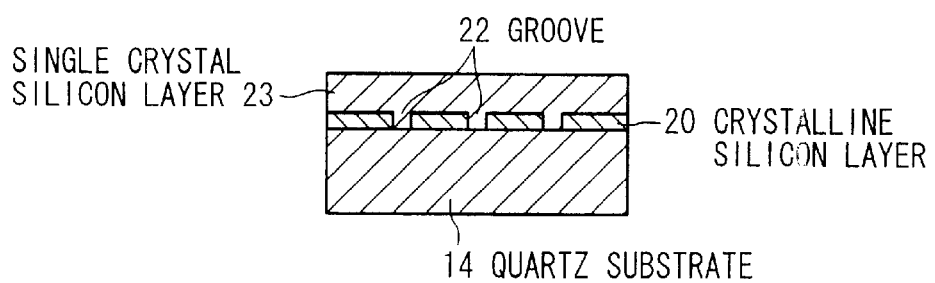

In FIG. 5D, numeral 23 designates a single-crystal silicon layer which has been formed from the p-type amorphous silicon layer 21 by heat treatment under the same conditions as used in Example 3. In this connection, it should be noted that, although any substrate layer for the formation of a single crystal is not present in the grooves 22, the single crystal is completely connected by virtue of the crystal growth of the silicon layer in the lateral direction from both sides of the grooves 22.

In this example, the single-crystal silicon layer 23 is formed after the removal of the portion 19a with a high nickel concentration and the portion 19b with a low nickel concentration. Therefore, even when the assembly is placed under a high-temperature process of about 1000° C., contamination with metal impurities does not occur. By virtue of this, when the so-called "SOI element" is constructed by forming a semiconductor integrated circuit in this region rather than on a thick substrate, good operation can be realized. This effect has been actually confirmed.

EXAMPLE 5

Figure 6A:
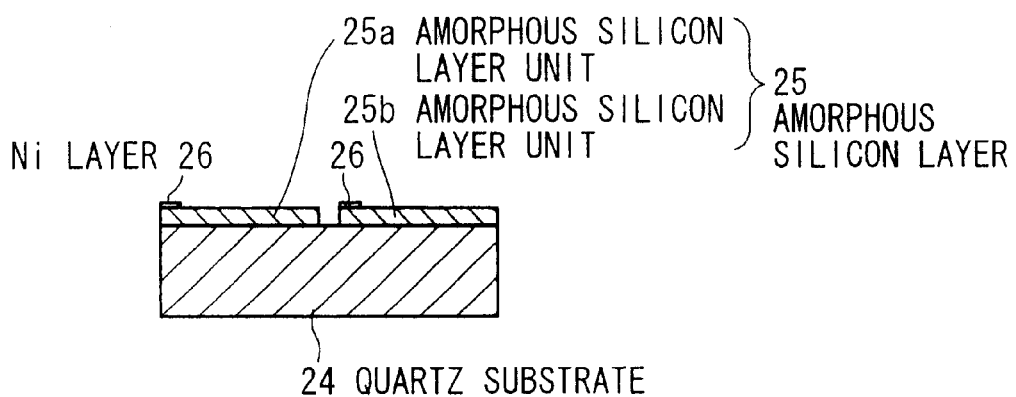
FIGS. 6A and 6B are cross-sectional views of products in the course of the formation of a crystalline silicon layer according to another preferred embodiment of the invention.

In FIG. 6A, an amorphous silicon layer 25 was first formed on the whole area of the quartz substrate 24. The amorphous silicon layer 25 was then fabricated into strip units 25a, 25b . . . . Next, nickel was vapor deposited to a thickness of 0.2 nm, followed by photoetching. Thus, a 15 μm-wide linear strip of a nickel layer 26 was formed along one long side of each of the units 25a, 25b . . . at a repeating pitch of 250 μm. Thereafter, heat treatment was carried out at 550° C. in nitrogen gas for 20 hr to crystallize an amorphous silicon layer 25.

Figure 6B:
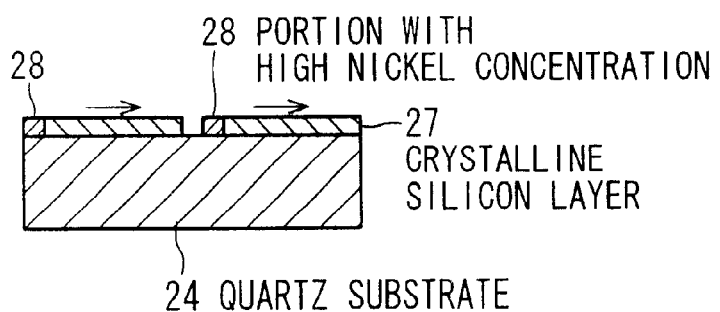

In FIG. 6B, numeral 27 designates a crystalline silicon layer formed by this process, and numeral 28 designates a portion with a high nickel concentration formed within the crystalline silicon layer 27.

This example is characterized in that the portion 28 with a high nickel concentration is not formed at the center of each of the units 25a, 25b . . . in a strip form in the crystalline silicon layer.

Figure 7A:
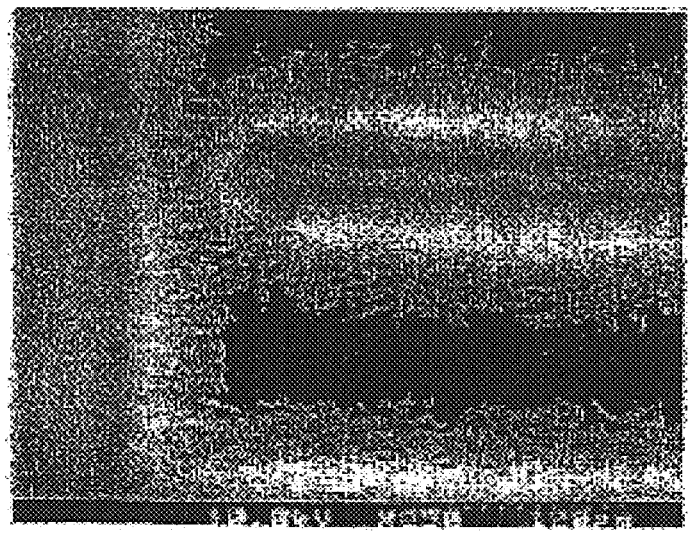

FIG. 7 shows an scanning electron micrograph illustrating an example of the inhibition of crystal growth by a high concentration of a dopant. When the dopant concentration is in the range of a substantially undoped state to about $2 \times 10^{20}/cm^3$, the crystallization is not influenced by the presence of the dopant. On the other hand, when the dopant concentration exceeds $2 \times 10^{20}/cm^3$, the crystallization rate is rapidly lowered. FIG. 7A shows the state of crystallization in the case of doping with phosphorus at a concentration of $2.5 \times 10^{20}/cm^3$. In this case, as is apparent from the drawing, the inhibition of the crystal growth is clearly observed.

Figure 7B:
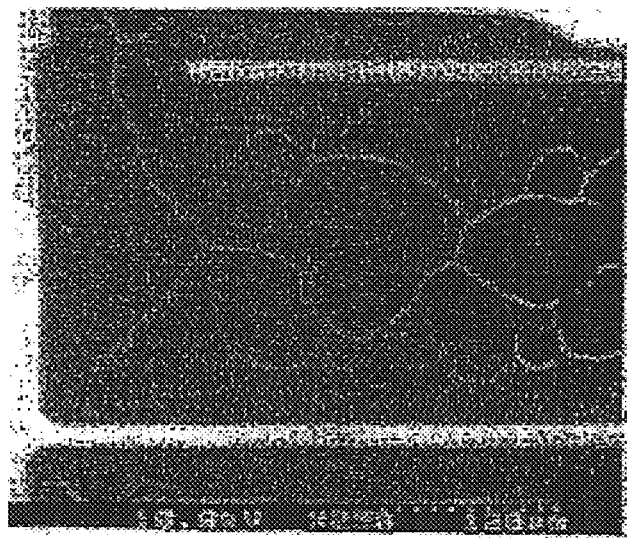

FIG. 7B shows an experiment of doping with boron at a concentration of $5 \times 10^{20}/cm^3$. As is apparent from the drawing, the nickel-containing portion is left in all directions in the layer, and, further, the crystal is randomly oriented rather than unidirecitonal orientation.

Therefore, the concentration of the dopant in the amorphous silicon layer according to the invention is preferably lower than these concentrations and should be in the range of about $1 \times 10^{18}/cm^3$, which is on a substantially i type level, to $2 \times 10^{20}/cm^3$.

As is apparent from the foregoing description, in the method for forming a crystalline silicon layer and the crystalline silicon semiconductor device according to the invention, a plurality of linear catalytic metal element portions are arranged at predetermined intervals just on or just beneath an amorphous silicon layer provided on a substrate and, in this state, heat treatment is carried out to crystallize the amorphous silicon layer. Therefore, the crystallization widely occurs in the presence of the plurality of linear catalytic metal element portions, and a high-quality crystalline silicon layer, which has been evenly oriented over the whole area of the substrate, can be formed. This can realize the provision of a crystalline silicon semiconductor device having a large effective area.

The invention has been described in detail with particular reference to preferred embodiments, but it will be understood that variations and modifications can be effected within the scope of the invention as set forth in the appended claims.

What is claimed is:

1. A method for forming a crystalline silicon layer, comprising:

forming an amorphous silicon layer on a substrate;

arranging a plurality of linear catalytic metal element portions at predetermined intervals just beneath the amorphous silicon layer formed on the substrate; and heat treating the amorphous silicon layer in the presence of the linear catalytic metal element portions to crystallize the amorphous silicon layer;

wherein the linear catalytic metal element portions just beneath the amorphous silicon layer are arranged by forming linear grooves on the substrate and filling the linear grooves with the catalytic metal element portions and the amorphous silicon layer is then formed on the substrate.

2. A method for forming a crystalline silicon layer, comprising:

forming a plurality of amorphous silicon layers, each in the form of a strip or the like on a substrate;

arranging a plurality of linear catalytic metal element portions at predetermined intervals on the amorphous silicon layer formed on the substrate; and heat treating the amorphous silicon layer in the presence of the linear catalytic metal element portions to crystallize the amorphous silicon layer;

wherein the linear catalytic metal element portions are arranged so as to be disposed at only one end of each of the plurality of the amorphous silicon layers.

3. A crystalline silicon semiconductor device comprising:

a substrate in which a plurality of linear grooves are formed at predetermined intervals;

a laminate comprised of crystalline silicon layers formed on said substrate; and an electrode provided at a predetermined position;

wherein said crystalline silicon layers include a crystalline silicon layer that is formed such that said plurality of grooves in said substrate are filled with a catalytic metal element and an amorphous silicon layer is then formed on said substrate and heat treated.

4. The crystalline silicon semiconductor device according to claim 3, wherein:

the laminate construction is such that the crystalline silicon layer has thereon another crystalline silicon layer, and the concentration of the catalytic metal element in the other crystalline silicon layer is not more than $1 \times 10^{17}/cm^3$.

5. A method for forming a crystalline silicon layer, comprising:

forming an amorphous silicon layer on a substrate;

forming a catalytic metal element in a groove just beneath the amorphous silicon layer formed on the substrate; and heat treating the amorphous silicon layer in the presence of the catalytic metal element to crystallize the amorphous silicon layer and thereby form the crystalline silicon layer.

6. The method of claim 5, wherein:

the amorphous silicon layer includes a plurality of separate amorphous silicon layer portions; and the catalytic metal element includes a plurality of separate catalytic metal element portions.

7. The method of claim 5, wherein the crystalline silicon layer formed by the heat treating has a first area with high metal concentration, a second area with a low metal concentration, and a third area disposed between the first and the second areas.

8. The method of claim 7, further comprising:

removing the first and the second areas from the crystalline silicon layer.

9. The method of claim 8, wherein the substrate includes the groove.

10. The method of claim 9, further comprising:

forming the groove in the substrate.

11. A method for forming a crystalline silicon layer, comprising:

forming an amorphous silicon layer, having a plurality of separate amorphous silicon layer portions, on a substrate;

forming a catalytic metal element, having a plurality of separate catalytic metal element portions, with each of the plurality of separate catalytic metal element portions being disposed on a different one of the amorphous silicon layer portions formed on the substrate;

heat treating the amorphous silicon layer in the presence of the catalytic metal element to crystallize the amorphous silicon layer and thereby form the crystalline silicon layer having a first area and a second area; and removing one of the first and second areas.

12. The method of claim 11, wherein forming the catalytic metal element includes arranging the plurality of separate catalytic metal element portions so as to be disposed proximate to only one end of each of the plurality of separate amorphous silicon layer portions.

13. The method of claim 11, wherein the first area is formed with a high metal concentration, the second area is formed with a low metal concentration, and the crystalline silicon layer formed by the heat treating has a third area disposed between the first and the second areas.

14. The method of claim 13, further comprising:

removing the other of the first and second areas from the crystalline silicon layer.

* * * * *